(12) United States Patent
Kohler et al.

(10) Patent No.: US 7,374,869 B2
(45) Date of Patent: May 20, 2008

(54) LITHOGRAPHIC PROCESSING METHOD AND DEVICE MANUFACTURED THEREBY

(75) Inventors: Carsten Andreas Kohler, Veldhoven (NL); Jan Bernard Plechelmus Van Schoot, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 645 days.

(21) Appl. No.: 10/830,418

(22) Filed: Apr. 23, 2004

(65) Prior Publication Data
US 2004/0265710 A1 Dec. 30, 2004

(30) Foreign Application Priority Data
Apr. 24, 2003 (EP) .................................. 03252585

(51) Int. Cl.
G03F 7/20 (2006.01)
G03F 1/00 (2006.01)
G03F 7/26 (2006.01)

(52) U.S. Cl. .......................... 430/394; 430/5; 430/322; 430/311

(58) Field of Classification Search ................ 430/394, 430/5, 322
See application file for complete search history.

(56) References Cited

U.S. PATENT DOCUMENTS

| 5,604,059 | A | 2/1997 | Imura et al. |
| 6,413,685 | B1 * | 7/2002 | Tsai et al. ...................... 430/5 |
| 6,627,392 | B2 * | 9/2003 | Pforr et al. .................. 430/394 |
| 6,873,720 | B2 * | 3/2005 | Cai et al. ..................... 382/149 |
| 2002/0150841 | A1 | 10/2002 | Wang et al. |
| 2002/0172901 | A1 * | 11/2002 | Tokushima ................... 430/394 |
| 2003/0157808 | A1 * | 8/2003 | Lin et al. ..................... 438/717 |

OTHER PUBLICATIONS

K. Aramaki et al., "Techniques to Print sub-0.2 μm Contact Holes," *Advances in Resist Technology and Processing*, vol. 3999, 2000, pp. 738-749, XP002256207.
Aramaki et al., "Techniques to Print sub-0.2 μm Contact Holes," *Proceedings of SPIE, Advances in Resist Technology and Processing XVII* 3999:738-749 (2000).

* cited by examiner

*Primary Examiner*—Mark F. Huff
*Assistant Examiner*—Brittany Raymond
(74) *Attorney, Agent, or Firm*—Pillsbury Winthrop Shaw Pittman, LLP (57) ABSTRACT

A lithographic double exposure processing method for providing to a device layer a pattern comprises the steps of expanding each feature of a first mask pattern and second mask pattern with a preselected dilatation distance before the first and second exposure steps, resist-processing the exposed radiation sensitive layer of a substrate to provide resist-processed features corresponding to said pattern whereby each resist-processed feature is expanded with respect to its nominal size, and shrinking said resist-processed features over a preselected shrinking distance by applying supplementary resist-processing to said resist-processed features.

22 Claims, 9 Drawing Sheets

LITHOGRAPHIC PROCESSING METHOD AND DEVICE MANUFACTURED THEREBY

BACKGROUND OF THE INVENTION

This application claims priority from EP application no. 03252585.9 filed Apr. 24, 2003, the contents of which is incorporated herein in its entirety.

1. Field of the Invention

The present invention relates generally to a lithographic apparatus and more particularly to a method of exposure using multiple exposures.

2. Description of the Related Art

A lithographic apparatus is a machine that applies a desired pattern onto a target portion of a substrate. The apparatus generally comprises a radiation system for supplying a beam of radiation, a support structure for supporting a patterning device, the patterning device serving to pattern the beam, a substrate table for holding a substrate, and a projection system for projecting the patterned beam of radiation onto a target portion of the substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system." The radiation system may also include components operating according to any of these design types for directing, shaping or controlling the projection beam of radiation, and such components. The radiation system as well as the projection system generally comprise components for directing, shaping or controlling the projection beam of radiation. Generally, the projection system comprises means to set the numerical aperture (commonly referred to as the "NA") of the projection system. For example, an adjustable NA-diaphragm can be present in a pupil of the projection system. The radiation system typically comprises adjusting means for setting the outer and/or inner radial extent (commonly referred to as σ-outer and σ-inner, respectively) of the intensity distribution upstream of the mask (in a pupil of the radiation system).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

A circuit pattern corresponding to an individual layer of an IC device generally comprises a plurality of device patterns and interconnecting lines. Device patterns may comprise features of different spatial arrangement such as, for example, line-space patterns ("bar patterns"), capacitor contact patterns, patterns of contact holes and DRAM isolation patterns. A feature is not necessarily characterized by a shape whose line elements define a closed contour. For example, a spatial arrangement of extremities of two neighboring features and a space between the two extremities may also, in the context of the present text and claims, be referred to as a feature.

In the context of the present text and claims, sizes of features are referred to as those sizes that the features nominally have at substrate level. At a mask, the size of a feature is M times larger than the nominal size, where M is the magnification of the projection system (typically, |M|=¼ or ⅕). Generally, additional size deviations at the mask are introduced to compensate for errors occurring, for example, during projection and exposure of a pattern; such a re-sizing of features of the sub-pattern is referred to hereinafter as biasing and/or Optical Proximity Correction ("OPC"). An amount of biasing and/or OPC is also commonly expressed in terms of a corresponding, nominal amount of re-sizing at substrate level. The noun "target" when used in expressions such as "target features" is indicating that these features have substantially a nominal size as desired for the device layer.

Fabrication of a circuit pattern involves the control of space tolerances between features, interconnecting lines, and between elements of a feature as well as the control of the size of features and feature elements. With increasing demands on the number of features per area of die to be printed, resolution enhancement techniques have been developed to improve the resolution limit obtainable with a lithographic processing method using a projection lithography apparatus. The smallest space between two lines permitted in the fabrication of a device layer and/or the smallest width of a line or of any other feature such as, for example, a contact hole, is referred to as the critical dimension ("CD"). Features comprising a minimum size substantially equal to the CD are referred to as "CD-sized features" in the present text.

Optimal performance of a lithographic processing method and usage of the lithographic projection apparatus at its ultimate resolution are specifically required for the lithographic processing of patterns comprising arrays of CD-sized features (such as for example contact holes) spaced apart at a distance substantially equal to the CD. For such arrays of features a pitch P of the periodicity can be defined, which then in this case is substantially equal to twice the CD. A pitch whereby P=2 CD is the minimum pitch at which CD-sized features can be arranged for printing with a lithographic processing method. The layer may also comprise CD-sized features positioned in one or more arrays at a pitches larger than 2 CD. In particular, the printing of layers comprising CD-sized contact holes occurring at both minimum pitch and larger pitches is of importance and requires state-of-the-art resolution enhancement measures. Generally, "dense features" are commonly known to be separated apart by a distance ranging between one and two times the target feature dimension; similarly, "isolated features" are commonly known not to be separated apart by a distance less than two times the target feature dimension. However, there is no commonly accepted exact definition of "dense features;" neither is there a commonly accepted exact definition of "isolated features." In the text hereinafter, CD-sized features occurring at any pitch between the minimum pitch of 2 CD and a pitch of 3 CD may be referred to as dense features, and CD-sized features occurring at pitches larger than 3 CD may be referred to as isolated features.

Further, the concept of pitch in the present text and claims also applies to clusters of at least two features, in which case "pitch" refers to the mutual distance between two corresponding points of two identical, neighboring features.

The resolution limit of the projection apparatus is one of the characteristics determining the CD obtainable with a lithographic manufacturing process. This resolution limit is generally dictated by the NA of the projection system and the wavelength of the radiation of the projection beam. The conventional approach to enhance resolution is to increase the NA and to reduce the wavelength. These measures have as side effect that depth of focus and insensitivity to residual errors in exposure dose of irradiated target portions become small. The combined usable depth of focus and allowable variance of exposure dose for a given tolerance in the size CD of a CD-sized feature as processed is usually referred to as process latitude. Preferably resolution enhancement measures should not affect process latitude, and therefore a minimum required and obtainable process latitude is presently another characteristic determining the smallest CD obtainable with a lithographic manufacturing process.

Resolution enhancement can be obtained by applying, for example, off-axis illumination modes for imaging dense features. Also, the use of on-axis illumination in combination with a phase shift mask ("PSM") as a patterning device for imaging isolated and/or dense features is known. For example, an alternating PSM whereby a device pattern is embodied as an electric field phase-shifting pattern of transmissive material with phase shifts of either 180° phase shift or 0° phase shift can be used to print dense line space structures of sub-wavelength pitch. Presently, resolution enhancement is of particular importance for printing device layers comprising both dense and isolated CD-sized contact holes. For printing (i.e., exposing and resist processing) these layers, typically an attenuated Phase Shift Mask (referred to hereinafter as an "att PSM") is used for patterning the projection beam, and further, the projection system is set at maximum NA and a conventional illumination at high σ-outer setting is used. For example, contact holes of 90 nm size occurring at minimum and larger pitches can in principle be printed with a single exposure lithographic processing method using a projection lithography apparatus equipped with a 193 nm wavelength radiation source and a projection system of NA=0.9, whereby the illumination mode is set at σ-outer=0.75 and a 6% att PSM is used for patterning the projection beam. The process latitude, however, is very critical with respect to depth of focus. For the example described above at 8% exposure latitude only about 110 nm depth of focus is available. Typically, because of substrate unflatness and residual focus errors a depth of focus of the order of 200 to 300 nm is required for enabling control of CD within limits in a manufacturing site; with a depth of focus of the order of 110 nm production of device layers with 90 nm contact holes at minimum and larger pitches is not feasible.

To improve resolution limit so-called "double exposure" processes are used as well. Typically, a lithographic processing method whereby an alternating PSM is used as a patterning device involves two exposure steps. Since only 180° phase shift or 0° phase shift are patterning parameters, alternating PSM's feature, besides desired phase shift transitions, also inevitable undesired phase shift transitions from 180° phase shift to 0° on transparent regions of the mask. The undesired phase shift transitions give rise to undesired intensity dips in an aerial image of the pattern. The latter intensity dips can be compensated for by a second exposure (to level out intensity dips). The two exposures can be performed with corresponding optimally chosen (but generally different) illumination settings. This process, however, does not result in a substantial improvement of process latitude.

Another double exposure approach addresses the problem of the occurrence of spurious features ("side lobes") in a projected image of a reticle pattern of dense contact holes, due to interference of radiation diffracted at the reticle pattern. To alleviate this problem, the pattern of dense contact holes is split up in two or more partial patterns of less densely packed contact holes. Imaging of such less dense patterns is less critical with respect to side lobes, and leads to an improvement of process latitude, however the improvement is a fractional one. Therefore, there is the problem of enhancing process latitude of a lithographic processing method for printing patterns comprising both isolated and dense features while at least maintaining sufficient the resolution.

SUMMARY OF THE INVENTION

One aspect of embodiments of the present invention provides a lithographic processing method for providing a desired pattern to a target portion of a layer of radiation sensitive material using multiple exposure, the pattern comprising a plurality of features whereby the densest features are arranged at a pitch P. The method further includes, separating the plurality of features into a first and a second sub-set of features, constituting a first and a second sub-pattern, each sub-pattern having densest features at a pitch greater than P, providing first and second adapted sub-patterns by expanding each feature of the first and second sub-pattern, performing a first exposure of the target portion with a beam of radiation patterned in accordance with the first adapted sub-pattern, performing a second exposure of the target portion with a beam of radiation patterned in accordance with the second adapted sub-pattern, the second exposure being arranged in juxtaposed registry with the first exposure, resist-processing the exposed radiation sensitive layer to provide an intermediate pattern comprising features in accordance with the combined adapted first and second sub-patterns, and applying supplementary resist-processing for shrinking the features of the intermediate pattern to match the size of shrunken features to the size of corresponding features of the desired pattern.

Notice that in the context of the present text and claims a distinction exists between the features of the desired pattern, and the corresponding features (larger in size) of the intermediate pattern. The former and latter features may, for simplicity, be referred to hereinafter by "target features" and "resist processed features" respectively.

Given a desired pattern, the applicability of a double exposure process when run on a given lithographic apparatus and based on splitting the desired pattern in two sub-patterns with features less dense than the features of the desired pattern, can be assessed in terms of a process latitude minimally required for the printing of each sub-pattern. In general, a process latitude enabling the printing of a pattern depends on parameters comprising the characteristics of the desired pattern (such as the CD and the range of pitches at which CD-sized features occur in the desired pattern), the characteristics of the lithographic apparatus in use (such as the illumination mode, the wavelength of the patterned beam, the maximum numerical aperture of the projection system), and the characteristics of the pattern provided to the reticle (for example, a binary pattern or an attenuated Phase Shift pattern). Therefore, when process latitude is used as criteria for enabling of printing, and different lithographic processes are compared, these characteristics have to be accounted for.

Generally, a marginally acceptable process latitude is considered to be a process latitude allowing for 8% exposure latitude and at least 300 nm Depth of Focus for printing dense and isolated CD-sized features simultaneously. This process latitude will be referred to hereinafter as a "marginal process latitude," but depending on production circumstances a different process latitude may be labeled as "marginal." Inversely, when a marginal process latitude is specified a-priori, and when the characteristics mentioned above are taken into consideration, a smallest printable feature dimension (and hence, a critical dimension CD) follows a-posteriori. If the lithographic process includes a processing step for shrinking features, a CD does not, in general, follow a-posteriori in the sense described above, unless account is given of the characteristics of that processing step. For the description of the present invention, it is convenient to distinguish between a critical dimension CD printable without applying any shrinking process (and definable in the a-posteriori sense described above) and a desired critical dimension smaller than CD (printable, for example, by applying a shrinking process). Where necessary, the latter critical dimension (smaller than CD) will be referred to as "shrunken CD," and be denoted by CDS.

By patterning the projection beam with first and second sub-patterns whereby each feature of the first and second sub-pattern is expanded, and by subsequently exposing and resist-processing the exposed radiation sensitive layer to provide resist-processed features that are larger than the corresponding target features, the requirements on maximum NA and r-outer setting can be relaxed compared to the requirement for these parameters valid for the case where resist-processed features are to be provided that are of nominal size (i.e., the size of the target features). Such a reduction of NA and σ-outer setting leads to a substantial increase of process latitude. According to an aspect of the invention, application of the relaxation of requirement in combination with applying the supplementary resist-processing is exploited to improve process latitude over a marginal process latitude obtainable with a similar double exposure process whereby the expanding and shrinking of features is omitted. Alternatively, a lower cost lithographic projection apparatus featuring a lower NA can be used for printing the same, desired target pattern. As another alternative, the requirements on wavelength of the projection beam radiation can be relaxed. A relaxation of wavelength requirement also results in an improved process latitude.

The step of resist-processing the exposed radiation sensitive layer (to provide a plurality of resist-processed features) generally comprises processes such as, for example, a post-exposure bake, a resist development, and a hard bake. In the context of the present text and claims, the step of resist-processing can include application of biasing and OPC techniques as mentioned above. For example, a biasing of features to suppress side lobe intensity distributions in the image at the target portion is often applied and comprises expanding features of a sub-pattern with a preselected dilatation distance before exposure. Such an expansion step is not part of the present invention; in practice that step is combined with a step of lowering the exposure dose so that after resist-processing the resulting resist-processed features are not expanded with respect to corresponding target features. A disadvantage of such biasing is that the lowering of the exposure dose results in a decrease of obtainable process latitude. In contrast, according to the present invention the resist-processed features are expanded with respect to the corresponding target features, i.e., they are over sized. The expansion of each feature of the first and second sub-pattern with a preselected dilatation distance before the first and second exposure can, for example, be an expansion on top of an expansion related to biasing.

In order to provide target features (at nominal size) the resist-processed features (which according to the present invention are over sized) are shrunk over a preselected shrinking distance to compensate for the over size. The shrinking is provided by applying supplementary resist-processing to the resist-processed features. For the supplementary resist processing one can use known resist process shrink techniques. For example, a chemical and a thermal resist processing for shrinking features can be gleaned from "Low-pitch dependence of RELACS process of ArF lithography for 65-nm generation," J. Shih, SPIE Proceedings 5039, 2003, and "Photoresist reflow for 193-nm low k1 lithography contacts," P. K. Montgomery et al., SPIE Proceedings 5039, 2003, respectively. These techniques have been shown to enable feature size correction of up to 50 nm shrink in a controlled way.

According to an aspect of the invention, the providing of the adapted sub-patterns in combination with applying the supplementary resist-processing is exploited to enable the printing of a desired pattern comprising dense CDS-sized features including CDS-sized features arranged at a minimum pitch smaller than 2 CD, while maintaining a marginal process latitude for printing the sub-patterns. This is achieved by:

splitting up the CDS-sized features into a first and a second sub-set of CDS-sized features, constituting a first and a second sub-pattern, each sub-pattern having densest features at a pitch equal to or greater than 2 CD;

expanding the CDS-sized features of each sub-pattern up to corresponding CD-sized features to provide adapted sub-patterns which are printable with substantially marginal process latitude;

performing a first exposure of the target portion with a beam of radiation patterned in accordance with the first adapted sub-pattern;

performing a second exposure of the target portion with a beam of radiation patterned in accordance with the second adapted sub-pattern, the second exposure being arranged in juxtaposed registry with the first exposure;

resist-processing the exposed radiation sensitive layer to provide an intermediate pattern comprising features in accordance with the combined adapted first and second sub-patterns; and applying supplementary resist-processing for shrinking the features of the intermediate pattern to match the size of shrunken features to the size of corresponding features of the desired pattern.

In the present case an enhancement of process latitude is exchanged for an enhancement of obtainable critical dimension CDS and of obtainable maximum density of features with this critical dimension. A pattern with CDS-sized features at a minimum pitch of 2 CDS can be now be printed, whereas this would not be possible with single exposure imaging or conventional double exposure imaging unless one would accept a below marginal process latitude. The latter option, however, is not feasible in production circumstances. The exchange mentioned above is pushed to its limit when the first and second exposures involving imaging of the amended sub-patterns is just possible with marginal process latitude. According to an aspect of the invention, a partial exchange between enhancement of process latitude and enhancement of obtainable critical dimension CDS and of obtainable maximum density of features with this critical dimension is possible as well.

The method according to the invention is of particular advantage when the device pattern to be printed comprises a plurality of transmissive dense features of critical dimension CD, separated from each other by a distance of the order of CD (i.e., the features are located at a pitch of the order of twice the CD). In a single exposure process biasing to suppress side lobe printing could be applied but would result in a decrease of process latitude. Further, there is a limitation to the maximum allowable dilatation: an expansion larger than the bias could not be applied, because the resulting opaque area between two features would become smaller than the CD, and therefore not printable in a controlled way. By splitting up the device pattern into two sub-patterns, this limitation can be avoided. For example, with a 193 nm wavelength projection apparatus 90 nm contact holes at pitches ranging from 180 nm to 800 nm cannot readily be printed at a typical single exposure process latitude of 8% exposure latitude due to the limited depth of focus (of the order of 110 nm). With the method according to the present invention the minimum pitch of contact holes in each of the sub-patterns is 360 nm for this example, and an expansion and a shrink of the order of 30 nm can be applied. As a result a process latitude of 8% exposure latitude at 460 nm depth of focus is obtained.

A device pattern comprising a plurality of features can be decomposed into two sub-patterns using a design rule check algorithm. Such algorithms are available in electronic design automation software which is used for design evaluation and modification, e.g., for optical proximity correction. Such decomposition algorithms are of use with the present invention when the mutual distance between any two neighboring features of the device pattern is at least a critical dimension CD, and the mutual distance between any two neighboring features in the first and second sub-pattern obtained after decomposition is at least twice the critical dimension CD. This increase of mutual distance enables an expansion of sub-pattern features on top of a re-sizing in view of biasing and/or OPC without violating a limit to the minimum absorber width between two transmissive sub-pattern features. This minimum width is determined by mask fabrication technology. Presently widths of the order of 100 nm (at substrate level) are feasible. Alternatively the increase of mutual distance can be exploited for placement of assist features (i.e., features which do not print such as scatter bars) to provide further Optical Proximity Correction, whereas such placement would not have been possible in the desired pattern due to lack of space between neighboring features.

A device pattern comprising a plurality of features can be such that it is not possible to apply a decomposition into two sub-patterns, whereby both sub-patterns satisfy the condition that the mutual distance between any two neighboring features in the first and second sub-patterns obtained after decomposition is at least twice the critical dimension CD, whereas it is possible to obtain at least one sub-pattern satisfying the condition. In that situation the one sub-pattern not satisfying the condition can be further split, and if necessary the splitting can be repeated until each obtained sub-pattern satisfies the condition. In that case the invention is not limited to a double exposure process, but includes a multi exposure process, whereby the number of exposures is in accordance with the number of sub-patterns obtained.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 μm).

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e., bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE PRESENT INVENTION

Lithographic Apparatus

Figure 1:
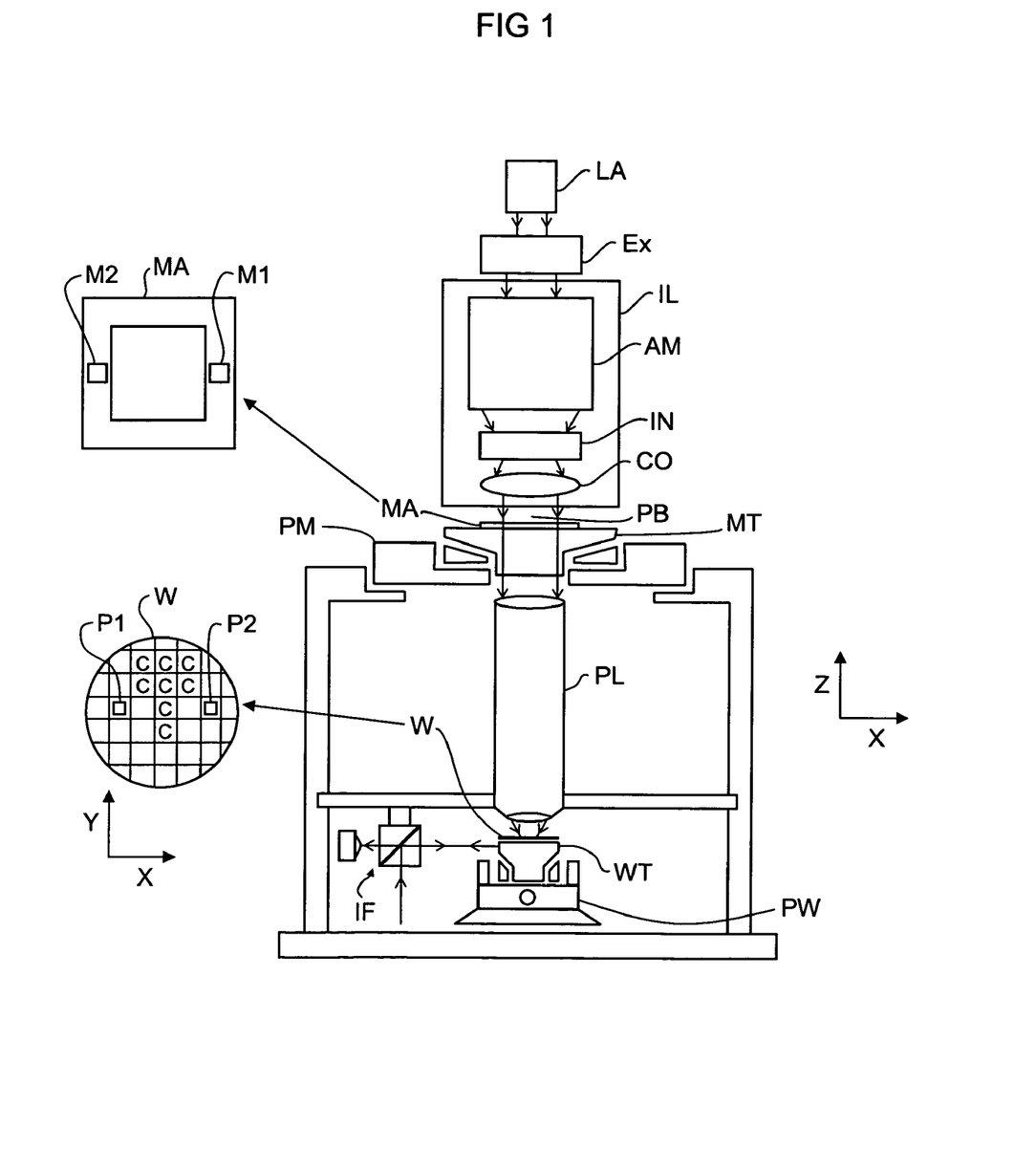
FIG. 1 depicts a lithographic projection apparatus according to an embodiment of the invention.

FIG. 1 schematically depicts a lithographic projection apparatus which may be used in the methods of the invention. The apparatus comprises:

- a radiation system Ex, IL, for supplying a projection beam PB of radiation (e.g., UV radiation or DUV radiation of a wavelength of less than about 270 nm, such as wavelengths of 248, 193, 157, and 126 nm radiation). In this particular case, the radiation system also comprises a radiation source LA;
- a first object table (mask table) MT provided with a mask holder for holding a mask MA (e.g., a reticle);
- a second object table (substrate table) WT provided with a substrate holder for holding a substrate W (e.g., a resist-coated silicon wafer); and
- a projection system ("lens") PL (e.g., a quartz and/or $CaF_2$ lens system or a catadioptric system comprising lens elements made from such materials, either suitable for conventional imaging or suitable for imaging in the presence of an immersion fluid) for imaging an irradiated portion of the mask MA onto a target portion C (e.g., comprising one or more dies) of the substrate W.

As here depicted, the apparatus is of a transmissive type (i.e., has a transmissive mask). However, in general, it may also be of a reflective type, for example (with a reflective mask). Alternatively, the apparatus may employ another kind of patterning device, such as a programmable mirror array of a type as referred to above.

The source LA (e.g., a UV mercury arc lamp, or a DUV excimer laser) produces a beam of radiation. This beam is fed into an illumination system (illuminator) IL, either directly or after having traversed conditioning optics, such as a beam expander Ex, for example. The illuminator IL may comprise adjustable elements AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g., with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of positioner not explicitly depicted in FIG. 1 (and interferometers or linear encoder IF), the substrate table WT can be moved accurately, e.g., so as to position different target portions C in the path of the beam PB. Similarly, additional positioners (not explicitly depicted in FIG. 1) can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at once (i.e., a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash." Instead, the mask table MT is movable in a given direction (the so-called "scan direction," e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Embodiment 1

Figure 5:
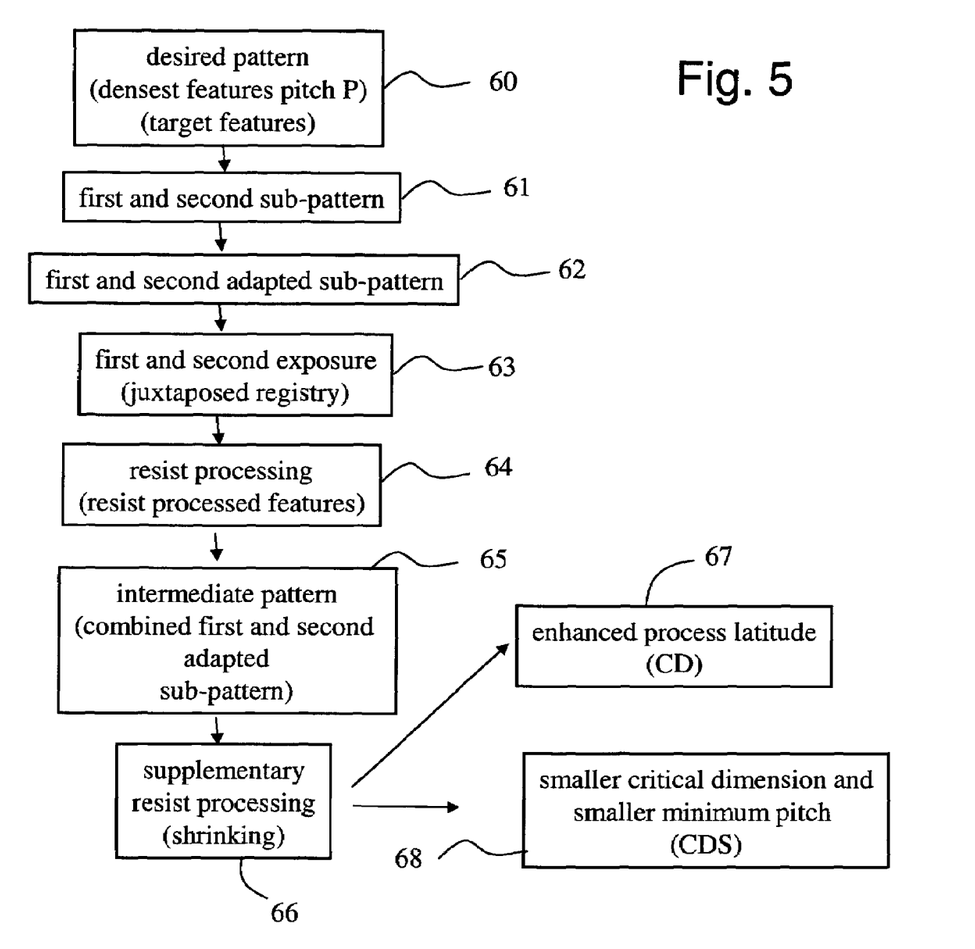
FIG. 5 is an schematic illustration of the method according to the present invention.

The method according to the present invention is schematically indicated in FIG. 5. Data defining a desired pattern having densest features at a pitch P is used as input information 60 for separating the pattern into a first and second sub-pattern 61, for example in terms of a data set on a data carrier for use with a computer. Commercially available mask pattern design check rule tooling can be used for splitting the pattern into the sub-patterns, whereby the minimum pitches occurring in the sub-patterns are larger than P. Next, the data 61 are adapted such as to provide corresponding adapted sub-pattern data 62 whereby the features of the sub-patterns are expanded in size. Typically, the expansion corresponds to a preselected dilatation distance of the edges of the features, substantially independent of the nominal size of a feature. Therefore, in general, the expansion is not expressible as a single magnification factor to be applied to the features, unless all the features are congruent of shape. The dilatation is in general not directionally uniform. Depending on the detailed characteristics of the supplementary resist processing 66 and the spatial distribution of the features of the adapted sub-patterns, account may have to be given of proximity effects which result in some directional non-uniformity of the shrinking. The data 62 representative for the adapted sub-patterns are used to generate corresponding patterns for use with patterning devices such as reticles for patterning a beam of radiation. Subsequently, a first and second exposure are executed 63. This implies of course that a marginal process latitude is available for performing these exposures. Upon resist processing 64 an intermediate pattern 65 in the resist is obtained, the intermediate pattern corresponding to the combined first and second adapted sub-patterns (taking into account of the magnification of the projection system, for example). The features are larger than the target features of the desired pattern in view of the expansion applied when adapting the sub-patterns. Finally, the features are shrunk by applying a supplementary resist processing 66 such as, for example, a thermal reflow treatment. The merit of the method is that any mixture of enhancement of process latitude for printing CD-sized features over a marginal process latitude for printing such features 67 and of reduction 68 of smallest critical dimension CDS which can be processed and of a corresponding smallest pitch at which such CDS-sized can be obtained.

Figure 2:
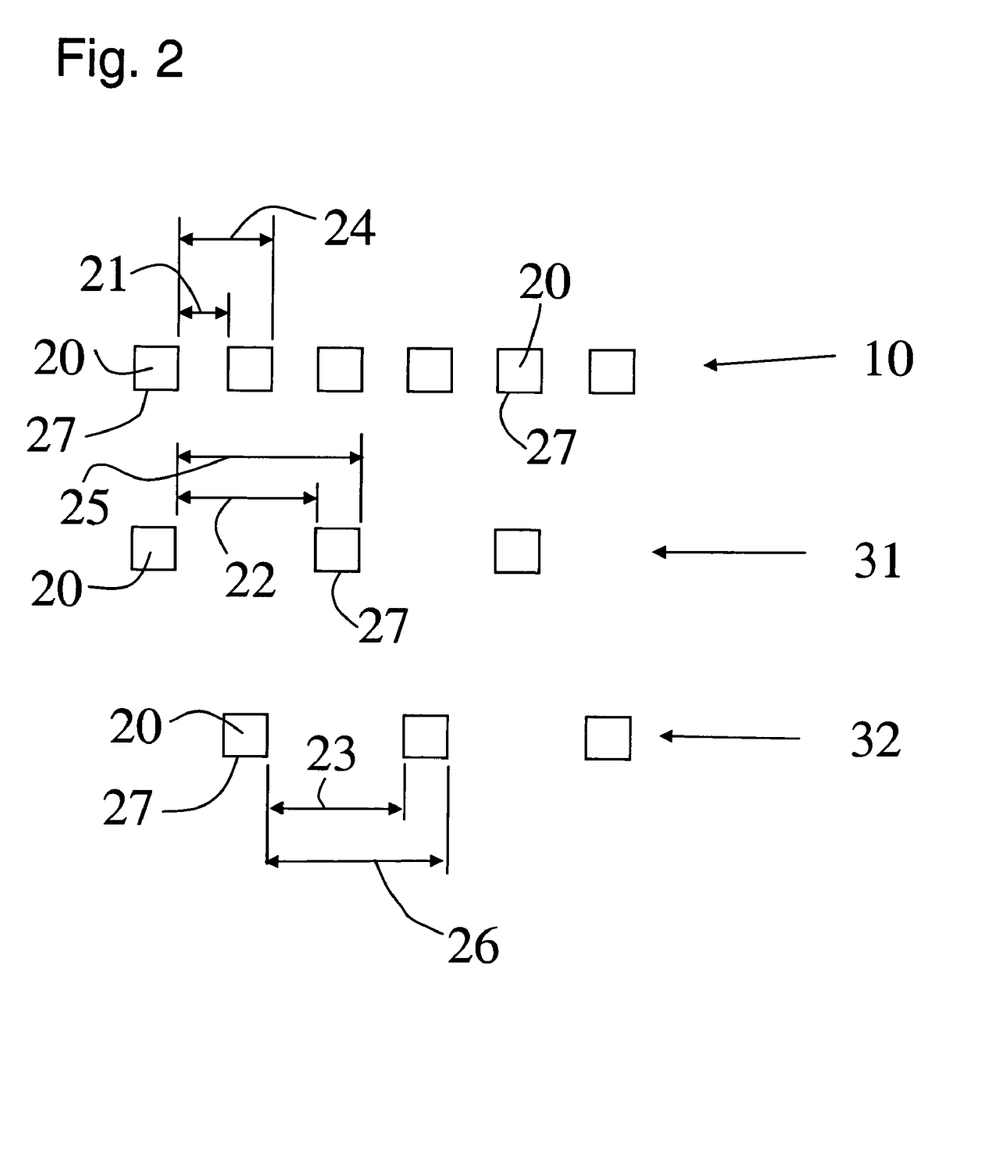
FIG. 2 depicts a device pattern comprising an array of square contact holes, and two sub-patterns.

In a first embodiment of the invention, a device layer with a desired pattern comprising a plurality of contact holes is printed using a 0.9 NA lithographic projection apparatus, 6% att PSM's to pattern the projection beam, and using positive tone resist suitable for use with 193 nm wavelength of the projection beam radiation. In this embodiment the device pattern comprises a linear array 10 of square contact holes 20 with sides 27, as shown in FIG. 2. The smallest dimension of each contact hole is the length of a side 27; this length is 90 nm corresponding to the critical dimension CD. In pattern 10 the contact holes are separated at least a distance CD as indicated by the arrow 21. The minimum pitch present in pattern 10 is denoted by P and indicated by the arrow 24 in FIG. 2. Here, P=2 CD. The pattern may further comprise contact holes 20 separated from any of the contact holes present in pattern 10 and from each other at a pitch larger than P. For simplicity, such contact holes are not shown.

Pattern 10 is split in a first and second sub-pattern 31 and 32 respectively, using a commercially available design check rule tool. The mutual distance between neighboring contact holes in the patterns 31 and 32 is indicated by arrows 22 and 23 whereby this distance is 3 CD. The patterns 31 and 32 have a pitch P1 and P2, respectively indicated by arrows 25 and 26. Here P1=P2=2 P=4 CD. So the pitch of the sub-patterns is relaxed by a factor 2.

If the steps of expanding and shrinking according to the invention are not applied, the design check rule tool would provide a bias prescription of 15 nm on top of the 90 nm size resulting in a length of 120 nm for a side for a contact hole. The biasing is applied in order to suppress side lobe printing during exposure of the sub-patterns. To arrive at the target size of the side length of 90 nm the exposure dose is lowered. The amount of biasing is dependent on NA setting and σ-outer setting of the projection apparatus. Again, if the steps of expanding and shrinking according to the invention are not applied, optimal settings for the exposures of this embodiment are NA=0.85 and sigma=0.6. The corresponding process latitude is shown by the solid line 41 in graph 40 of FIG. 3. The solid line 41 indicates the relation between percentage exposure latitude and nanometers depth of focus for a given, maximum allowable deviation from printed CD (of 10% of nominal CD). X1 and Y1 represent a depth of focus of 140 nm and 8% exposure latitude respectively.

Figure 3:
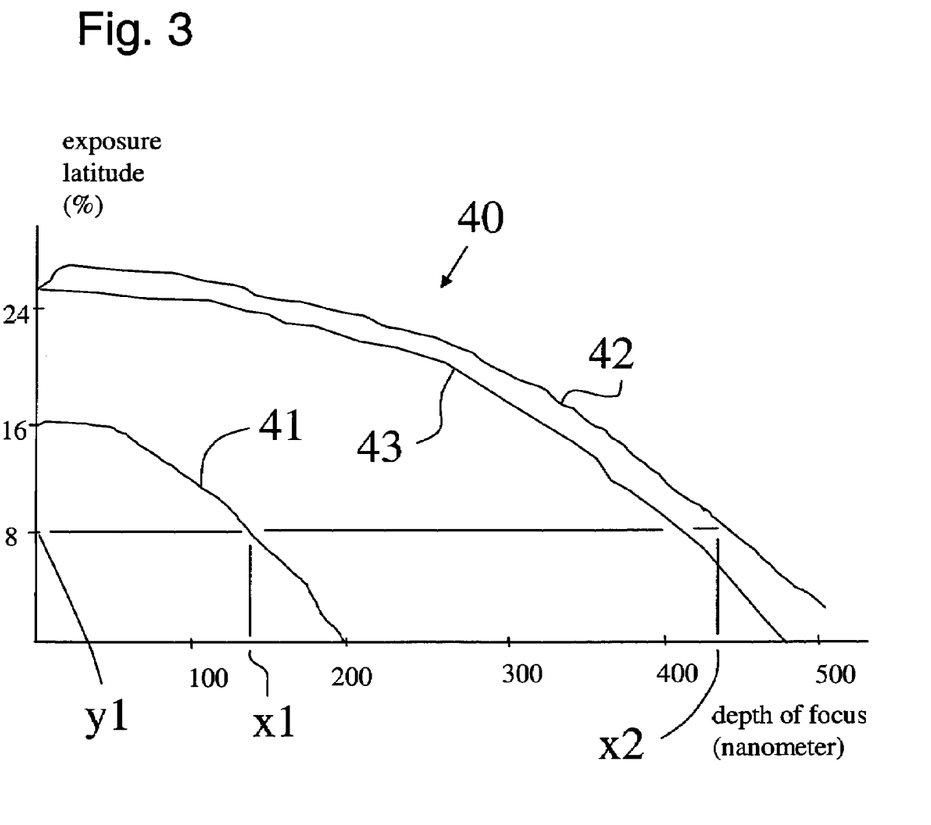
FIG. 3 shows a graph indicating process latitudes for an exposure of a single exposure process and for exposures of a double exposure process according to the present invention.

According to the present embodiment of the invention, the size of the contact holes is expanded by a dilatation distance of 15 nm on top of a bias of 10 nm, resulting in a side length of squares 27 corresponding to M times 140 nm at mask level. Hence, at wafer level the length of a side of an expanded contact hole after applying the standard resist processing step is targeted at 120 nm. This increase of size renders the printing much less sensitive to exposure dose and focus errors. Both adapted sub-patterns in this embodiment are embodied as 6% att PSM patterns. Optimal NA -and σ-outer setting are now found to be NA=0.75 and σ-outer=0.4, for each exposure. The plot 42 in graph 40 in FIG. 3 shows the resulting process latitude for the expanded contact holes of the adapted sub-patterns (corresponding to the CD-sized contact holes 20 separated at a pitch 4 CD of the first and second sub-patterns 31 and 32). At a constant exposure latitude of 8% the depth of focus has increased up to 440 nm. Graph 43 in FIG. 3 similarly shows the process latitude for any isolated expanded contact holes (corresponding to CD-sized contact holes not shown in FIG. 2) at a pitch much larger than 4 CD.

After performing the first and second exposure, the exposed radiation sensitive layer is subjected to resist-processing to provide the corresponding array of square resist-processed contact holes, now with an over sized side length of 120 nm, and spaced apart at a pitch of 180 nm. Next, a known resist processing technique such as for example a chemical treatment is used to shrink the contact holes to their final target size of 90 nm. As a result, an array of 90 nm contact holes at a pitch of 180 nm is obtained, at a process latitude of 8% exposure latitude at 440 nm depth of focus. From the plot 42 in graph 40 relating to a process of printing an array of contact holes located at 360 nm pitch (the minimum pitch of a sub-pattern) an the plot 43 it follows that the present process according to the invention features substantially the same exposure latitude for contact holes not shown in FIG. 2 and which are separated from any of the contact holes present in pattern 10 and from each other at a pitch larger than 360 nm. The invention enables the manufacturing of device layers comprising CD-sized features with CD of the order of 90 nm at minimum and larger than minimum pitch, whereby either the NA -and σ-outer setting of a NA=0.9 lithographic projection system can be relaxed to NA=0.75, σ-outer=0.4, or a lower cost NA=0.75 lithographic projection system can be used.

According to an aspect of the invention, an increase of minimum available space between the features of the adapted sub-patterns over minimum available space between features in the desired pattern is exploited for placement of assist features (i.e., features which do not print such as scatter bars) in an adapted sub-pattern to provide Optical Proximity Correction, whereas such placement would not have been possible in the desired pattern due to lack of space between features.

For the description above of the present embodiment the process latitude, as represented by plot 41, is assumed to be the marginal process latitude, even though the Depth of Focus is less than 300 nm (which, for example, under research circumstances can be acceptable). Therefore, no distinction was made between CD and a critical dimension CDS smaller than CD. When the embodiment is considered in such a way, it represents an example where the method according to the invention is exploited exclusively to enhance process latitude, as suggested by result 67 in FIG. 5. If however, plot 41 cannot be considered as representing a marginal process latitude (as would be the case under production circumstances) then the processing of 90 nm CD-sized contact holes is considered not possible without applying the supplementary resist processing 66, and in the description above to a critical dimension of 90 nm for a target feature size should have been referred to as CDS, and CD would have been a size larger than 90 nm. This is, however, described in more detail below for another embodiment.

Figure 4:
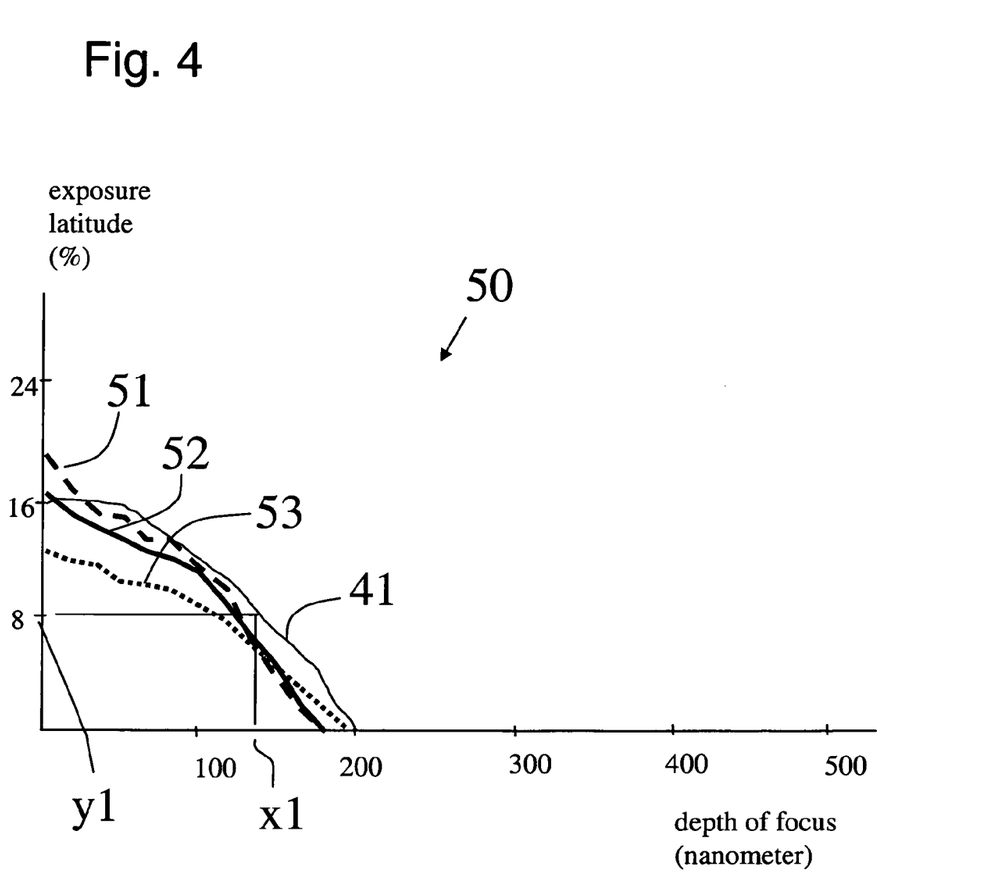
FIG. 4 illustrates process latitudes for an exposure of a single exposure process and for exposures of a double exposure process according to prior art.

In FIG. 4 the process latitude for single exposure conventional imaging (i.e., without applying expansion and shrink processes) of 90 nm contact holes arranged at a pitch of 360 nm (using optimal settings for the exposure: NA=0.85 and sigma=0.6) is given by plot 41, and is compared with process latitude plots 51, 52, and 53 which represent process latitudes for a single exposure conventional process optimized for simultaneously processing 90 nm contact holes arranged at a pitch of 180 nm (plot 53), 360 nm (plot 52) and 800 nm (plot 51), the optimal settings for such an exposure being NA=0.90 and sigma=0.75. Thus, in FIG. 4 the imaging of a sub-pattern such as pattern 31 in FIG. 2 is compared with the imaging of a complete desired pattern, such as schematically indicated by pattern 10 in FIG. 2. FIG. 4 shows that a mere splitting up of a desired pattern according to the present invention without providing adapted sub-patterns and applying a subsequent shrinking (thus, merely providing sub-patters which are less densely packed with features than the desired pattern), only yields a fractional improvement of process latitude: the area enclosed by plot 41 and the axes of FIG. 4 is only fractionally larger than each of the areas enclosed by the plots 51, 52, and 53 and the axes in FIG. 4. The same conclusion would hold if the area enclosed by the 8% exposure latitude line and the corresponding Depth of Focus line (such as the lines at x1 and y1 in FIG. 4) would be taken as measure for exposure latitude.

Embodiment 2

Figure 6:
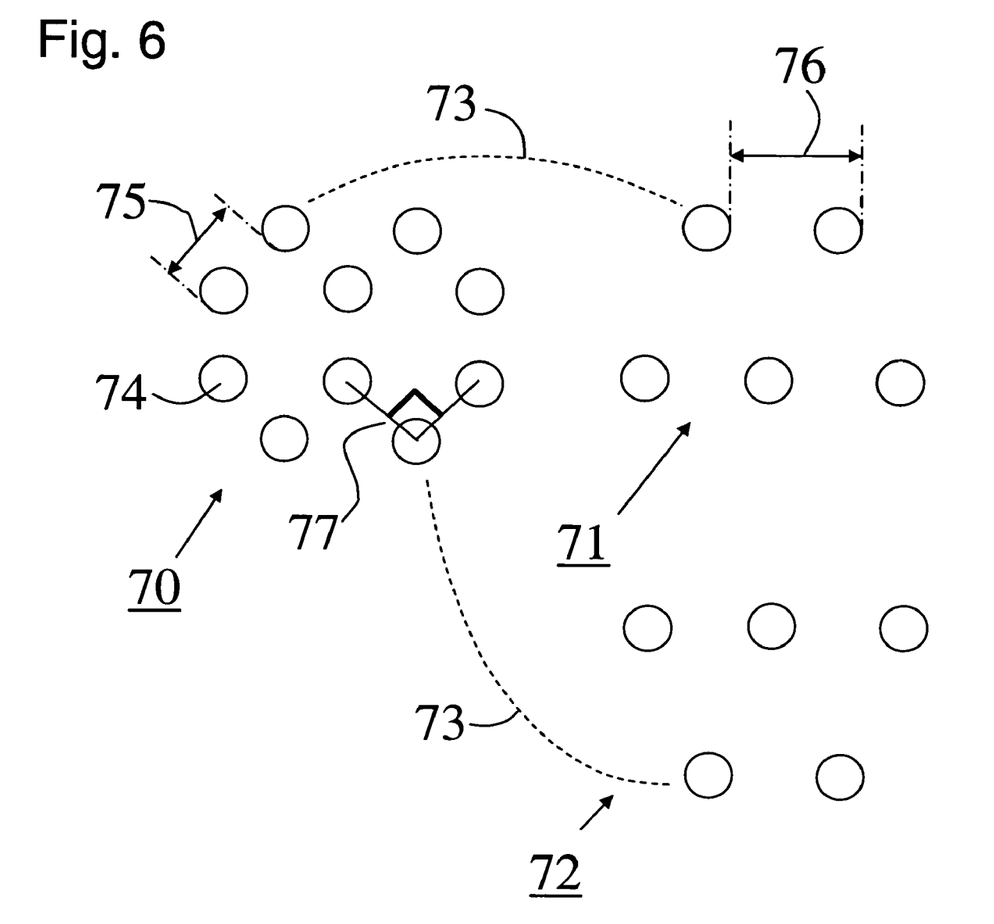
FIG. 6 depicts a desired pattern of contact holes matching a honeycomb grid, and two sub-patterns.
Figure 7:
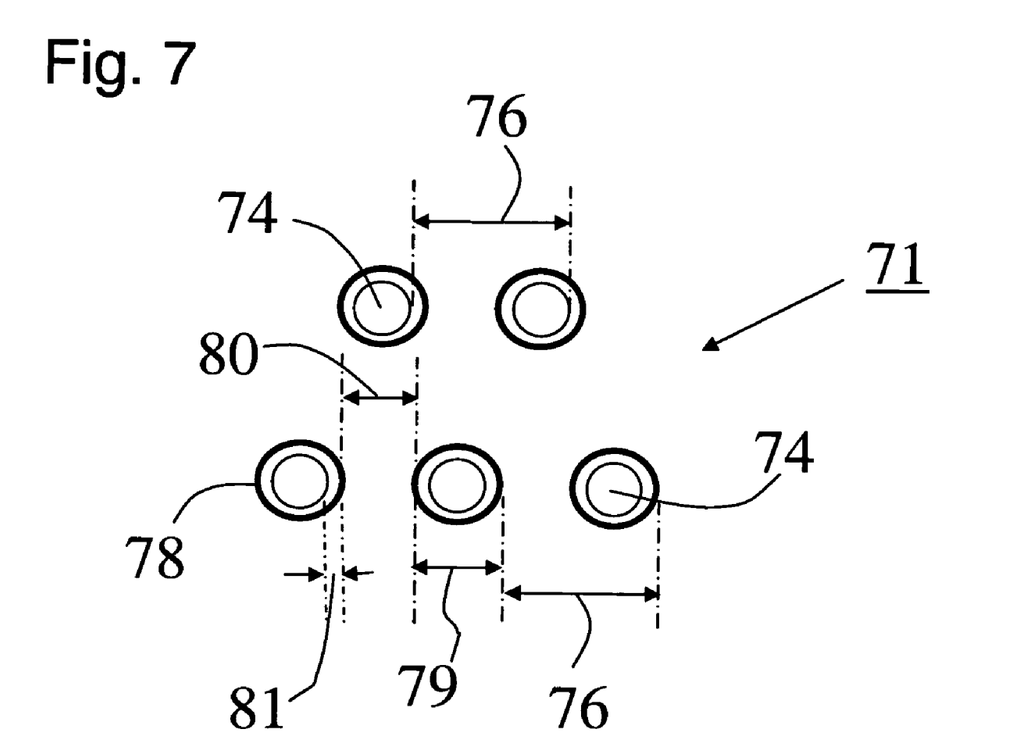
FIG. 7 depicts an adapted sub-pattern in accordance with one of the sub-patterns of FIG. 6.

An embodiment according to the present invention whereby the method is fully exploited to obtain a reduction of critical dimension (such as indicated by element 68 of FIG. 5) which can be processed in combination with a reduction of the minimum pitch for arrangements of such critical dimension sized features (i.e., the minimum pitch at which such an arrangement of contact holes can be patterned in the resist layer), is illustrated in FIGS. 6 and 7. A desired device pattern comprises dense contact holes 74 arranged in a honeycomb pattern of which a set of two unit cells 70 is shown in FIG. 6. The device pattern may further comprise isolated contact holes not shown in FIG. 6. The desired contact holes 74 occur at a minimum pitch P represented by arrow 75 in FIG. 6, which is twice the diameter of a single contact hole 74.

With the present embodiment, the method is used on a lithographic apparatus provided with a phase shift mask, however, even under optimized conditions the characteristics of the tooling are such that the desired pattern 70 cannot be processed in a single exposure because of lack of sufficient process latitude. Single exposure operation at marginal process latitude would allow for processing of contact holes with a size CD, at minimum pitch 2 CD; the diameter of the contact holes of the present desired pattern is denoted by CDS, whereby CDS is smaller that CD, and P is smaller than 2 CD. Notice that application of a supplementary resist processing for shrinking features would not lead to a reduction of minimum pitch (smaller than a pitch of 2 CD). The size of the contact holes would become smaller (down to a size CDS), but the minimum pitch would remain constant, at 2 CD. Defining the concept of duty cycle DC in the present context as DC=(size of a contact hole)/(pitch of contact hole pattern) the effect of a supplementary resist processing for shrinking features would be that the minimum duty cycle in the pattern after processing has decreased below 0.5, whereas the desired pattern 70 features a minimum duty cycle of 0.5 (i.e., equal to CDS/(2 CD)).

For the present embodiment, the lithographic apparatus is a 0.9 NA apparatus operating at 193 nm. With such a machine a marginal process latitude is available for the printing of desired patterns comprising dense 120 nm contact holes at a minimum pitch of 240 nm. The size of the contact holes 74 is 90 nm and the minimum pitch P 75 is 180 nm.

Figure 8:
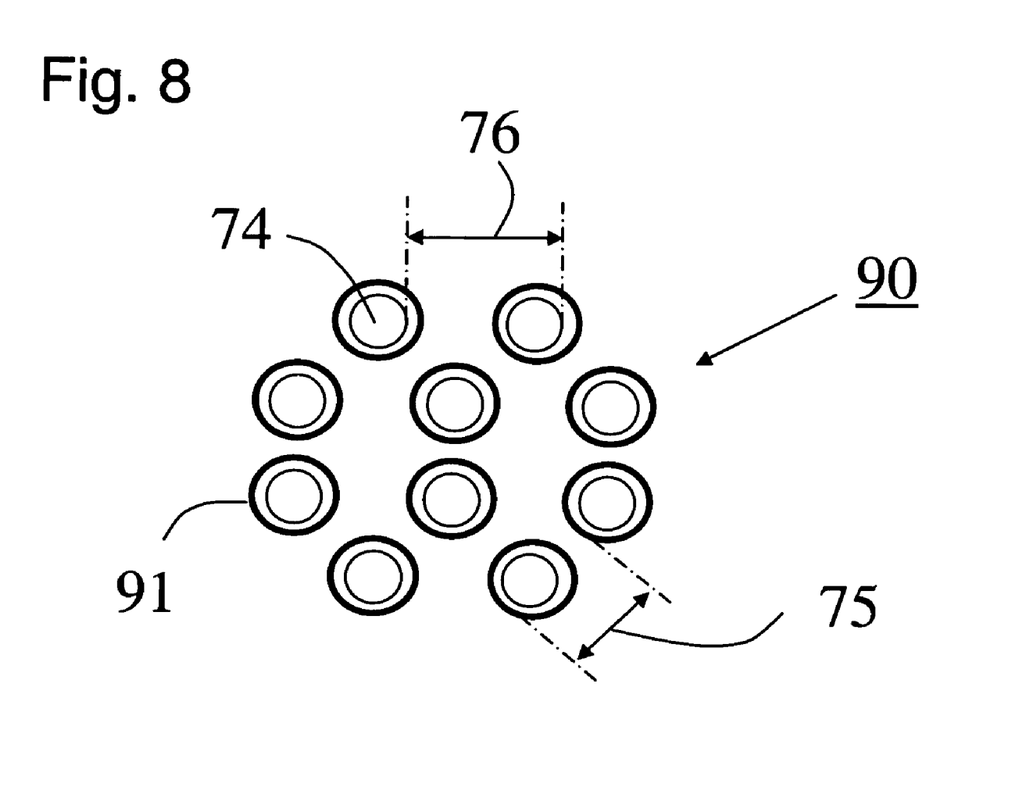
FIG. 8 depicts an intermediate pattern in accordance with the desired pattern shown in FIG. 6.

As shown in FIG. 6, the desired pattern 70 is split into two sub-patterns 71 and 72. Corresponding contact holes are indicated by the dashed lines 73. The original honeycomb structure is featuring a 90° angle 77, so that the smallest pitch in each of the sub-patterns is 1.4 times P; the pitch 76 equals 1.4×180=252 nm. The two sub-patterns are subsequently adapted by expanding CDS-sized contact holes 74 up enlarged contact holes 78. to such that the intermediate pattern (see result 65 in FIG. 5) features contact holes of 120 nm diameter. This result is obtained by expanding each feature of each sub-pattern with a preselected dilatation distance, as illustrated in FIG. 7. FIG. 7 shows an expanded contact hole 78 resulting from a dilatation 81 applied uniformly to a corresponding CDS-sized contact hole 74. For the present embodiment, the dilatation 81 should be 15 nm. This is the required dilatation scaled at substrate level to print 120 nm diameter contact holes. Given the lay-out of the sub-patterns 71 and 72, the resulting minimum distance 80 between two contact holes is 132 nm, and since 120 nm contact holes at a minimum pitch of 240 nm are marginally printable, the present adapted sub-pattern can be printed with (slightly more than) marginal process latitude. At the level of the reticle or any other patterning device, account must be taken of any required biasing and/or optical proximity correction in view of, for example, contact holes present in a sub-pattern at a pitch different from 2 CD such as the upper left and lower left contact hole in FIG. 7 as well as other more isolated contact holes not shown in either pattern 70 or the patterns 71 and 72. At reticle level, a maximum allowable dilatation is limited by the mask resolution (i.e., the smallest feature size that can be patterned in a mask). Typically, the mask resolution is of the order of 80 nm, which in the present embodiment would not impose a limitation. With a magnification factor 0.25 of the projection system, the pitch 76 at mask level is 1008 nm, and the nominal size of a contact hole is 360 nm at mask level, so that in principle at mask level a uniform dilatation of 324 nm−80 nm=244 nm would be possible. In view of any biasing and/or optical proximity correction one should be able to accommodate an extra dilatation of the order of 20% of the nominal contact hole size. Such an extra expansion is, in the present case, at mask level 72 nm and hence is well below the limit of 244 nm. Consequently, using the adapted sub-patterns for the exposures while arranging the second exposure in juxtaposed registry with the first exposure, and resist processing the doubly exposed resist layer an intermediate pattern 90 as shown in FIG. 8 comprising dense resist processed contact holes 91 is obtained. The smallest pitch in the intermediate pattern is the pitch 75 of 180 nm. Application of a supplementary resist processing step (process 66 in FIG. 5) is next used to shrink the resist processed features 90 down to the size of the target features 74, being the CDS-sized contact holes of the desired pattern 70. As a result a pitch 180 nm, 90 nm contact hole honeycomb pattern is obtained using an apparatus suitable for printing at best a pitch 240 nm, 120 nm contact hole honeycomb pattern. In a similar manner, application of the method using a lithographic apparatus operating at 157 nm wavelength and an appropriate mask type, featuring sufficient process latitude to print a pitch 200 nm, 100 nm contact hole pattern, can be used to obtain a pitch 140 nm, 70 nm contact hole honeycomb pattern.

Embodiment 3

An embodiment according to the present invention is the same as embodiment 1 or 2, whereby attenuating PSM's with attenuating phase shift absorbers between sub-pattern features are used to enhance the process window.

Generally, attenuating PSM's feature an additional chrome shielding of attenuated absorber areas to enhance aerial image contrast. With the present method such an additional chrome shielding of attenuated absorber areas of each of the sub patterns is not needed. It has been verified that in a double exposure process according to the invention any background radiation passing an attenuating absorber between two bright contact holes or short trenches as present in a sub-pattern, not substantially degrades the aerial image contrast.

Embodiment 4

Figure 9:
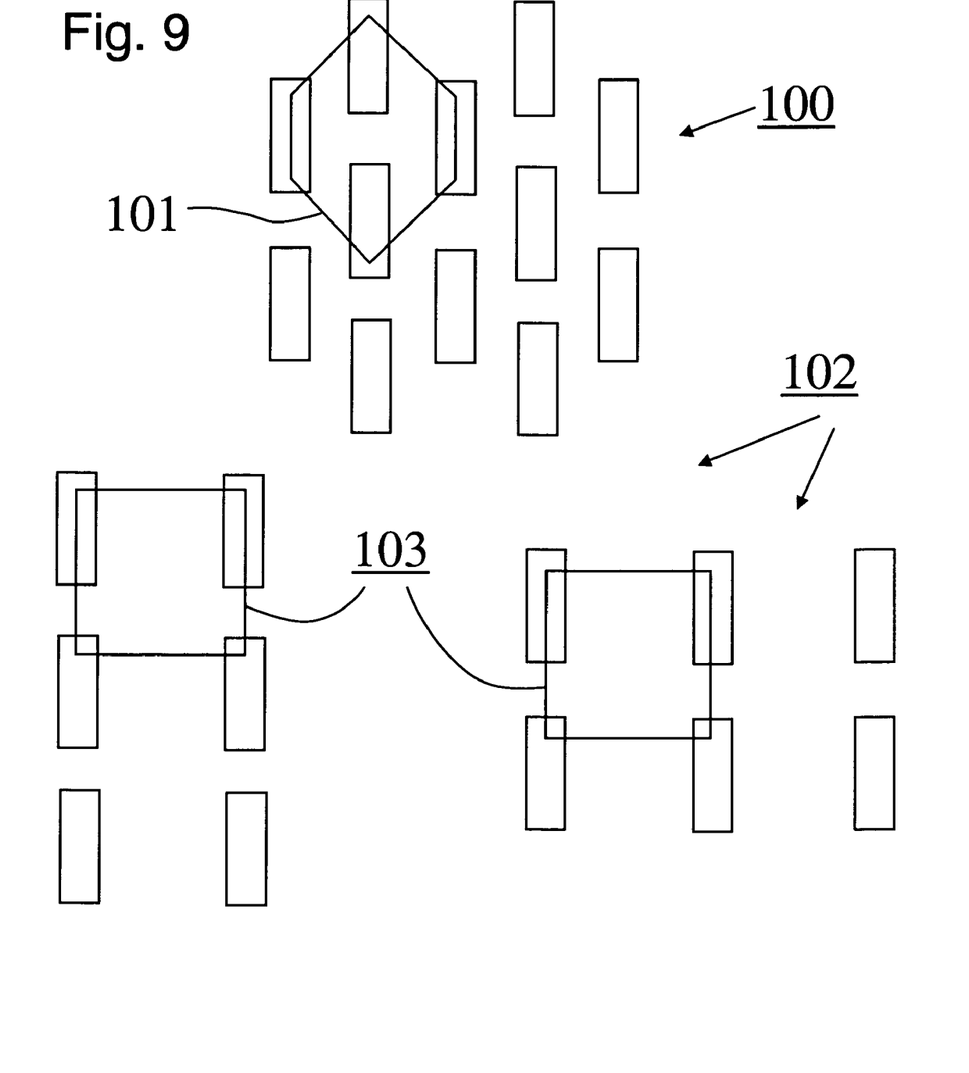
FIG. 9 illustrates a pattern of short trenches and two corresponding sub-patterns.

According to one embodiment of the invention the plurality of target features of the device pattern is a plurality of short trenches as illustrated in FIG. 9. Short trenches are elongated contact holes with an aspect ratio of up to 1:4. The smallest dimension of short trenches is generally equal to a critical dimension CD, and the processing of these features is therefore sensitive with respect to process latitude. The method according to the invention and as schematically indicated in FIG. 5 is applicable to such desired patterns of short trenches in a manner analogous to any of the embodiments 1-3. The endpoints of the short trenches of the desired pattern 100 in FIG. 9 may match a honeycomb grid 101, as illustrated in FIG. 9. The projection of such a pattern in a single exposure involves an imaging process which is sensitive to odd optical aberrations of the projection system of the lithographic apparatus in use. Examples of such odd aberrations are coma and three-wave aberration, its presence being caused by intrinsic limitations of the optical design of the projection system or by residual manufacturing errors or by residual environmental impact on the projection system. By splitting up the desired pattern into sub-patterns 102 such that the endpoints of the short trenches in the sub patterns match with a rectangular grid 103, the sensitivity for odd aberrations is reduced, which further enhances the process latitude for the imaging of the sub-patterns.

While a specific embodiment of the invention has been described above, it will be appreciated that the invention may be practiced otherwise than as described. The description is not intended to limit the invention.

The invention claimed is:

1. A lithographic processing method for providing a desired pattern to a target portion of a layer of radiation sensitive material using multiple exposure, the desired pattern comprising a plurality of features wherein the densest features thereof are arranged at a pitch P, the method comprising:
    providing first and second adapted sub-patterns by expanding each feature of each of a first and second sub-pattern by a value other than that associated with a demagnification, if any, associated with exposure of the first and second adapted sub-patterns, each sub-pattern having the densest features at a pitch greater than P and each sub-pattern being formed from a portion of the plurality of features of the desired pattern;
    performing a first exposure of the target portion with a beam of radiation patterned in accordance with the first adapted sub-pattern;
    performing a second exposure of the target portion with a beam of radiation patterned in accordance with the second adapted sub-pattern, the second exposure being arranged in a registry with the first exposure to form combined adapted first and second sub-patterns;
    resist-processing the exposed radiation sensitive layer to provide an intermediate pattern comprising features in accordance with the combined adapted first and second sub-patterns; and
    applying supplementary resist-processing to shrink the features of the intermediate pattern to match a size of shrunken features to a size of corresponding features of said desired pattern.

2. A lithographic processing method according to claim 1, wherein said expanding each feature of said first and second sub-pattern is arranged in accordance with an expansion over a preselected dilatation distance.

3. A lithographic processing method according to claim 2, wherein said preselected dilatation distance is a directionally non-uniform dilatation arranged to compensate for a directionally non-uniformity of said shrinking of the features of the intermediate pattern.

4. A lithographic processing method according to claim 1, 2 or 3, wherein said pitch P of said densest features is substantially equal to twice a critical dimension.

5. A lithographic processing method according to claim 4, wherein said critical dimension is associated with a marginal process latitude.

6. A lithographic processing method according to claim 5, wherein said marginal process latitude is defined by 8% exposure latitude and 300 nm depth of focus.

7. A lithographic processing method according to claim 5, wherein said marginal process latitude is defined by 8% exposure latitude and 110 nm depth of focus.

8. A lithographic processing method according to claim 1, 2 or 3, wherein said pitch P of said densest features is smaller than twice a critical dimension associated with a marginal process latitude for a lithographic processing method that does not include a supplementary resist-processing for shrinking features.

9. A lithographic processing method for providing a desired pattern to a target portion of a layer of radiation sensitive material using multiple exposure, said desired pattern comprising a plurality of features with a critical dimension CDS smaller than a critical dimension CD associated with a marginal process latitude for a lithographic processing method that does not include a supplementary resist-processing for shrinking features, wherein densest features are arranged at a pitch smaller than 2 CD, the method comprising:
   separating said plurality of features into a first and a second sub-set of features, constituting a first and a second sub-pattern, each sub-pattern having densest features at a pitch greater than 2 CD;
   expanding each feature of said first and second sub-pattern by a value other than that associated with a demagnification, if any, associated with exposure of the first and second adapted sub-patterns so that a dimension CDS of the first and second sub-set of features of the desired pattern is expanded up to the dimension CD, to provide first and second adapted sub-patterns which are printable with said marginal process latitude;
   performing a first exposure of said target portion with a beam of radiation patterned in accordance with the first adapted sub-pattern;
   performing a second exposure of said target portion with a beam of radiation patterned in accordance with the second adapted sub-pattern, said second exposure being arranged in a registry with said first exposure to form combined adapted first and second sub-patterns;
   resist-processing the exposed radiation sensitive layer to provide an intermediate pattern comprising features in accordance with the combined adapted first and second sub-patterns; and
   applying supplementary resist-processing to shrink the features of the intermediate pattern to match a size of shrunken features to a size of corresponding features of said desired pattern.

10. A lithographic processing method according to claim 9 wherein the separating said plurality of features comprises using a computer program for rule-based pattern design processing and pattern splitting to provide data representing said first and second sub-patterns.

11. A lithographic processing method according to claim 1, 2, 3, or 9 wherein said plurality of features comprises a plurality of contact holes.

12. A lithographic processing method according to claim 1, 2, 3, or 9 wherein said plurality of features comprises a plurality of short trenches.

13. A lithographic processing method according to claim 12 wherein endpoints of said plurality of short trenches match to a first grid, and wherein endpoints of corresponding sub-sets of short trenches in the first and second sub-patterns match to a second grid, wherein imaging of features on the second grid is less sensitive to odd optical aberrations as imaging of features on the first grid.

14. A lithographic processing method according to claim 12 wherein the first grid is a honeycomb grid, and wherein the endpoints of short trenches in the first and second sub-patterns match a rectangular grid.

15. A lithographic processing method according to claim 1, 2, 3, or 9 wherein in the first exposure said beam of radiation patterned in accordance with the first adapted sub-pattern is obtained by using a correspondingly patterned attenuated phase shift mask.

16. A lithographic processing method according to claim 1, 2, 3, or 9 wherein in the second exposure said beam of radiation patterned in accordance with the second adapted sub-pattern is obtained by using a correspondingly patterned attenuated phase shift mask.

17. A lithographic processing method according to claim 15 wherein in the second exposure said beam of radiation patterned in accordance with the second adapted sub-pattern is obtained by using a correspondingly patterned attenuated phase shift mask.

18. A lithographic processing method according to claim 1, 2, 3, or 9 wherein said supplementary resist-processing to shrink the features of the intermediate pattern comprises a chemical processing or a thermal processing.

19. A lithographic processing method according to claim 18 wherein said thermal processing comprises application of a resist thermal reflow process.

20. A lithographic processing method according to claim 18 wherein said chemical processing comprises application of an overcoating process and a baking process.

21. A lithographic processing method according to claim 1, 2, 3, or 9, wherein said first adapted sub-pattern or said second adapted sub-pattern comprises assist features for providing optical proximity correction.

22. A lithographic processing method according to claim 1, 2 or 3 wherein said first and second sub-patterns are separated from the desired pattern using a computer program for rule-based pattern design processing and pattern splitting to provide data representing said first and second sub-patterns.

* * * * *